United States Patent
Kirstein et al.

(10) Patent No.: US 7,595,452 B2
(45) Date of Patent: Sep. 29, 2009

(54) CIRCUIT BOARD AND METHOD FOR ITS PRODUCTION

(75) Inventors: Tünde Kirstein, Dietikon (CH); Ivo Locher, Zug (CH); Christoph Maurer, Zürich (CH)

(73) Assignee: Sefar AG, Ruschlikon (CH)

( * ) Notice: Subject to any disclaimer, the term of this patent is extended or adjusted under 35 U.S.C. 154(b) by 307 days.

(21) Appl. No.: 11/432,093

(22) Filed: May 11, 2006

(65) Prior Publication Data
US 2006/0254811 A1    Nov. 16, 2006

(30) Foreign Application Priority Data
May 13, 2005   (EP) .................... 05010475

(51) Int. Cl.
*H05K 1/00*   (2006.01)
(52) U.S. Cl. ...................... 174/250; 174/254
(58) Field of Classification Search ............. 174/254, 174/250, 256, 260; 361/760
See application file for complete search history.

(56) References Cited

U.S. PATENT DOCUMENTS

| | | | |
|---|---|---|---|
| 4,750,957 A * | 6/1988 | Gustafson | ........ 156/92 |
| 6,210,771 B1 | 4/2001 | Post et al. | |
| 6,852,395 B2 * | 2/2005 | Dhawan et al. | ....... 428/196 |
| 2004/0259391 A1 | 12/2004 | Jung et al. | |
| 2005/0029680 A1 * | 2/2005 | Jung et al. | ....... 257/787 |
| 2005/0069695 A1 | 3/2005 | Jung et al. | |
| 2006/0035554 A1 * | 2/2006 | Glaser et al. | ....... 442/301 |
| 2008/0099997 A1 * | 5/2008 | Branch et al. | ....... 273/407 |

FOREIGN PATENT DOCUMENTS

| | | |
|---|---|---|
| DE | 10338029 A1 | 4/2005 |
| WO | WO 01/36728 A1 | 5/2001 |
| WO | WO 03/021312 A1 | 3/2003 |
| WO | WO 2004/107831 A2 | 12/2004 |

* cited by examiner

*Primary Examiner*—Dean A. Reichard
*Assistant Examiner*—Yuriy Semenenko
(74) *Attorney, Agent, or Firm*—John A. Merecki; Hoffman Warnick LLC

(57) ABSTRACT

The invention relates to a circuit board and a method for its production. The highly flexible circuit board includes electrically non-conductive threads and electrically conductive threads. These threads form a fabric with a regular mesh structure. In the latter at least electrically conductive threads are used as warp threads and weft threads.

16 Claims, 2 Drawing Sheets

CIRCUIT BOARD AND METHOD FOR ITS PRODUCTION

FIELD OF THE INVENTION

The invention relates to a highly flexible circuit board comprising electrically non-conductive threads and electrically conductive threads. Furthermore, the invention relates to a method for producing a highly flexible circuit board which includes electrically non-conductive threads and electrically conductive threads.

BACKGROUND OF THE INVENTION

The use of electric devices in every day life is constantly on the increase. A majority of the population already carry mobile phones, PDAs or MP3-players with them on a regular basis. Apart from miniaturization of the devices, efforts are made to an increasing extent to integrate functions of the devices in textiles. For instance textiles are to be equipped with electric and electronic functions. Yet, it is of great importance here that the fundamental properties of the textiles, such as the wearing comfort, are not affected substantially.

From WO 03/052541 A2 and US 2004/0259391 A1 textiles are known which have single electric conductor lines. These conductor lines are selectively integrated in the textiles so as to connect or join specific electric components such as e.g. ICs.

The known textiles are provided with conductor lines at certain points only which are each arranged in an optimum manner for one particular application only. The conductor lines constitute point-to-point connections as they are known from flying wiring in electronics. Hence, for each new function that is to be integrated in a textile a new fabric having the appropriate conductor lines must be produced. Very often these conductor lines are therefore applied to or integrated subsequently in the textile, e.g. by imprinting the conductor lines or sewing them in. On the one hand this involves a great amount of work and on the other hand the circuits produced thereby are in many cases not particularly resistant and no longer function correctly after a short time.

Conventional printed circuit boards or circuit boards can only be used to a limited degree for the integration into textiles. They are inflexible and stiff. When functions are to be integrated in textiles by using conventional printed circuit boards the textile quickly loses its textile properties such as the wearing comfort. Likewise, other circuit boards, such as the ones on films, can only be employed to a limited extent for the integration in textiles. Despite the fact that the films do constitute an improvement compared to the conventional inflexible printed circuit boards, they deteriorate the textile properties unintentionally.

SUMMARY OF THE INVENTION

The invention provides a circuit board and a method for its production which can be combined easily with conventional textiles without deteriorating the textile properties.

A first aspect of the invention provides a highly flexible circuit board, in which electrically non-conductive threads and electrically conductive threads sheathed with an electrically insulating material are woven to a fabric, wherein: at least the electrically conductive threads are arranged as warp threads and weft threads and form a regular mesh structure in the entire fabric; and the electrically non-conductive threads have a higher tensile strength than the electrically conductive threads.

A second aspect of the invention provides a textile comprising at least two layers, wherein at least one layer comprises a fabric woven from electrically non-conductive threads and electrically conductive threads sheathed with an electrically insulating material, and wherein: at least the electrically conductive threads are arranged as warp threads and weft threads and form a regular mesh structure in the entire fabric; and the electrically non-conductive threads have a higher tensile strength than the electrically conductive threads.

A third aspect of the invention provides a method for producing a highly flexible circuit board, comprising: weaving electrically non-conductive threads and electrically conductive threads that are sheathed with an electrically insulating material to a fabric, and wherein the weaving further comprises: arranging at least the electrically conductive threads as warp threads and weft threads to form a regular mesh structure in the entire fabric.

In the highly flexible circuit board electrically non-conductive threads and electrically conductive threads that are sheathed with an electrically insulating material are woven to a fabric, wherein at least the electrically conductive threads are arranged as warp threads and weft threads and form a regular mesh structure in the entire fabric. Furthermore, the electrically non-conductive threads have a higher tensile strength than the electrically conductive threads.

A fundamental idea of the invention may be seen in the fact that specific conductor lines are no longer integrated into a textile or applied thereto for each application but that a textile-like circuit board is used that is combined with a conventional textile. This circuit board has a uniform distribution of electrically conductive threads which extend across the entire circuit board. Owing to the fact that electrically conductive threads are employed both as warp threads and as weft threads a grid extending across the entire circuit board is developed thereby. By connecting conductive weft threads with conductive warp threads any two chosen points on the circuit board can be connected without additional wiring. Any unwanted connections are prevented by the insulation. In this way the highly flexible circuit board can be used to apply electric and electronic components and to connect them as desired, in a manner similar to known conventional printed circuit boards.

Another fundamental idea of the invention is that the electrically non-conductive threads and the electrically conductive threads have a different tensile strength. Through the higher tensile strength of the electrically non-conductive threads the achievement is such that the electrically conductive threads are largely protected against tensile forces which occur when stress is applied to the circuit board. As a result, a breaking of the electrically conductive threads and therefore an electric interruption of the connections constituted by them is prevented. In most cases an interruption leads to a failure of the circuit realized on the circuit board.

Since the circuit board according to the invention is made of woven threads it has a high flexibility. With regard to its folding qualities, weight and other behaviour the circuit board has properties similar to those of conventional textiles. As a result, it is excellently suited to being combined with textiles.

In principle, the electrically non-conductive threads and the electrically conductive threads can have any chosen diameter. However, it proved to be of particular advantage if they have a diameter ranging between 0.5 μm and 500 μm. By the use of such thin threads a circuit board of extreme flexibility is achieved. In this manner the textile properties of a textile connected with the circuit board are not affected. A further reduction of the diameter of the threads results in a higher resistance of the electrically conductive threads which must be taken into account in forming the circuit.

According to the invention it is of particular advantage if the fabric has a mesh width from 1 µm to 1 mm and a thickness from 1 µm to 1 mm. Through such a small mesh width the achievement is made in that there is a sufficient number of conductor lines available both in the weft and in the warp direction. As a result, even very complicated circuits of electric components can be realized on the most compact space. Due to the small thickness of the circuit board according to the invention a textile connected with the board is not affected in its typical textile properties. For specific application purposes larger and smaller mesh widths or thicknesses are possible, too.

Moreover, owing to the small mesh width, the small thread diameter and the small thickness the fabric is extremely fine. This fineness permits the flexible use of the circuit board. It can be placed into the lining of garments without any problem and without the wearer being aware of any discomfort or negative effects.

The electrically conductive threads can be produced for example of electrically conductive plastic material or the like. In a preferred embodiment the threads have a core. For this purpose copper is particularly suitable on account of its high electric conductivity and the reduced costs compared to precious metals. Other materials suited for this purpose are for example brass, aluminium or polypyrrole, a conductive plastic. A small specific resistance is of advantage for the circuit board as, on the one hand, it should not warm up and, on the other hand, it is necessary when used in connection with textiles because in most cases there is only a mobile energy source available that has a limiting power.

A significant increase in electric conductivity is achieved in accordance with the invention in that the core of the electrically conductive threads is coated with silver and/or gold. As a result, the core is protected e.g. against oxidation on the one hand. On the other hand the electric conductivity of the conductive thread thus produced is increased further so that little loss of energy occurs in long conductor lines. What is more, a considerably improved contact can be attained in the point-wise connection of individual conductive threads.

The electrically conductive threads are used both as weft threads and as warp threads. In order to prevent the conductive threads from being connected and electrically conductive among each other at the points of intersection they have an insulation. It is especially preferred that the insulation is made of a plastic material, more particularly of polyethylene, polyurethane, polyester or polyamide. Plastic has the advantage that it can be removed easily e.g. by a laser. Through this a desired point-wise connection between two conductive threads can be produced. Other insulation materials are also possible. By preference, materials are used that can cover the conductive thread easily during production and can be removed later on at certain points without any problem.

Basically, the circuit board can be composed of monofilament threads. However, to increase strength it turned out to be advantageous for the fabric to have multifilament threads which are composed of the electrically non-conductive fibres and/or the electrically conductive fibres. Through this it is also possible to vary the structure of the circuit board in a particularly simple manner. Likewise, the tensile strength can also be influenced in a specific direction. A combination of monofilament threads and multifilament threads is possible, too.

In a particularly preferred embodiment the mesh structure of the circuit board formed by the conductive threads has the same spacing both in the weft thread direction and in the warp thread direction. By preference, this spacing ranges between 5 µm and 4 mm. Through a regular equal spacing the formation of a regular grid of conductive threads is achieved. This facilitates the development of computer programmes that determine in an automated manner the circuit and arrangement of various components on the circuit board. Through the preferred size of the grid the required number of electrically conductive threads is combined with a required number of non-conductive threads that account for the strength. Due to the extreme fineness of the grid there is a sufficient number of electrically conductive threads available so as to realize complex circuits, too.

In order to attain a sufficiently high strength of the circuit board it proved to be of advantage that more non-conductive threads than conductive threads are provided in the fabric to be produced. The relationship of the conductive and non-conductive threads can be adapted to the respective use. For example a greater number of conductive threads can be woven into the fabric if a complicated circuit is to be implemented that requires a lot of conductor lines. If the number of non-conductive threads is increased the circuit board gains a higher tensile strength and becomes more robust thereby.

In a particularly preferred embodiment at least one adapter element is mounted on the circuit board in electrically conductive contact with at least one of the electrically conductive threads. In addition, an electric and/or electronic component is mounted on the adapter element. Such an adapter element is necessary because a direct contact of the electrically conductive threads by a component is hardly possible on account of the extreme fineness of the fabric. By means of the adapter element it is rendered possible that exactly one conductive thread only is contacted in each case and that a double or faulty contact that may lead to a short circuit is prevented. The electronic component can be mounted on this adapter element without any problem. Moreover, through the adapter element which has a larger contact surface with the circuit board than the component the electronic component is connected in a better way with the circuit board.

Furthermore, according to the invention a textile consisting of at least two layers is provided, with at least one layer being constituted by the circuit board according to the invention. With this combination the attainment is made in that a textile can be provided with electronic functions without thereby losing the textile properties. The circuit board in accordance with the invention can be connected with the textile e.g. by being laminated in the latter. It is also possible that the circuit board according to the invention that has a circuit of electronic components implemented thereon is integrated in the lining of a textile consisting of several layers.

It is particularly preferred if at least one layer of the textile consists of a film, a fabric or a felt. This layer may serve as carrier material for the highly flexible circuit board. Depending on the use the textile consists of several layers or only of these two layers. Advantageously, the textile consists of at least three layers, in which case the centre layer is constituted by the circuit board which is then arranged in a particularly protected manner.

In the method according to the invention for producing the highly flexible circuit board electrically non-conductive threads and electrically conductive threads which are sheathed with electrically insulating material are woven to a fabric, in which at least the electrically conductive threads are arranged as warp threads and weft threads and form a regular mesh structure in the entire fabric.

By means of this method the highly flexible circuit board described above can be produced in a particularly simple and reliable manner. In principle, the production can be carried out with conventional looms. However, on account of the fineness of the threads used and the small mesh width it is preferred that the looms employed are specifically optimized for this purpose.

To build up a desired line structure particular electrically conductive threads are disconnected or connected. To connect two electrically conductive threads these two threads are stripped at their point of intersection e.g. by a laser by evaporating the insulation. Afterwards the two threads are connected with each other at the stripped point e.g. by a conductive adhesive. For protection of the point of connection it can additionally be hardened by means of plastic. The disconnection of an electrically conductive thread can also be effected by a laser. In order to prevent a contact of the two disconnected ends of a thread an insulating plastic is applied to both ends at the point of disconnection. Since the stability of the circuit board has been reduced through the disconnection it is useful to apply the insulating plastic such that it encloses both ends. In this manner the stability is increased again.

BRIEF DESCRIPTION OF THE DRAWINGS

In the following the invention will be described further by way of embodiments that are schematically illustrated in the drawings, wherein.

DETAILED DESCRIPTION OF THE INVENTION

Figure 1:
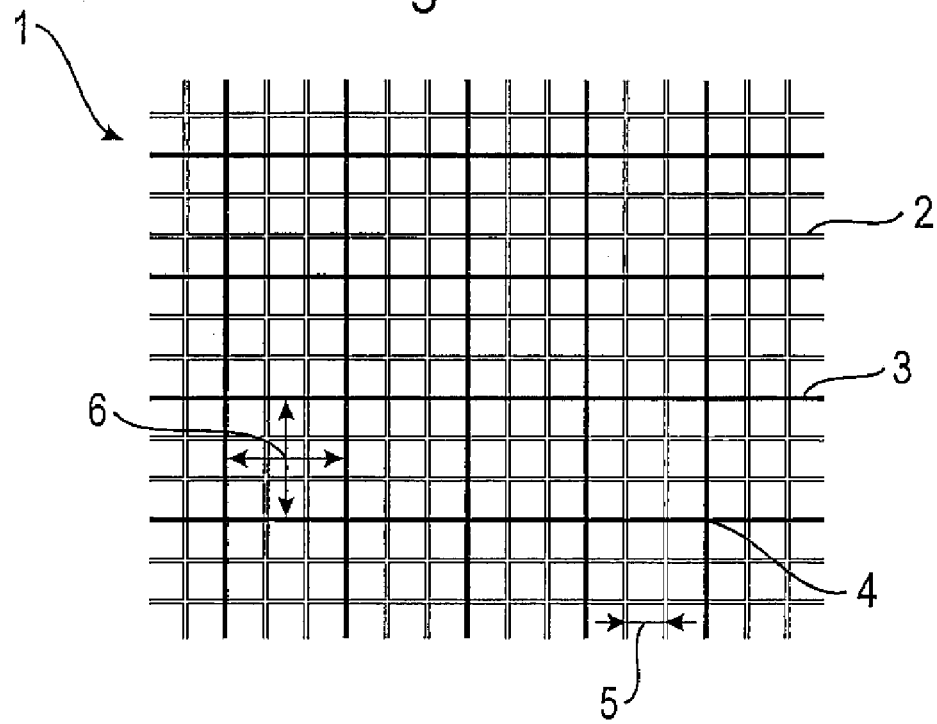
FIG. 1 shows a circuit board according to the invention comprising electrically conductive and non-conductive threads.

In FIG. 1 a schematized illustration of a circuit board 1 according to the invention is shown. The circuit board 1 consists of electrically non-conductive threads 2 and electrically conductive threads 3. In FIG. 1, electrically non-conductive threads 2 are depicted in grey, while electrically conductive threads 3 are depicted in black. The threads 2, 3 form a regular grid. The fabric developed by the electrically non-conductive threads 2 and the electrically conductive threads, 3 has a regular mesh width 5.

Since there are more electrically non-conductive threads 2 woven into the circuit board 1 than electrically conductive threads 3, the spacing 6 between the electrically conductive threads 3 is greater than the mesh width 5. In this case the ratio is 3:1. The higher the number of woven non-conductive threads 2, the higher the tensile strength of the fabric that constitutes the circuit board 1.

The electrically conductive threads 3 consist of a copper core that is coated with a thin gold or silver film. The thread thus produced is in turn sheathed with an insulating layer. Due to the insulating layer of the conductive threads 3 there is no electrical contact between the two threads 3 at the points of intersection 4 of these two electrically conductive threads 3.

Figure 2:
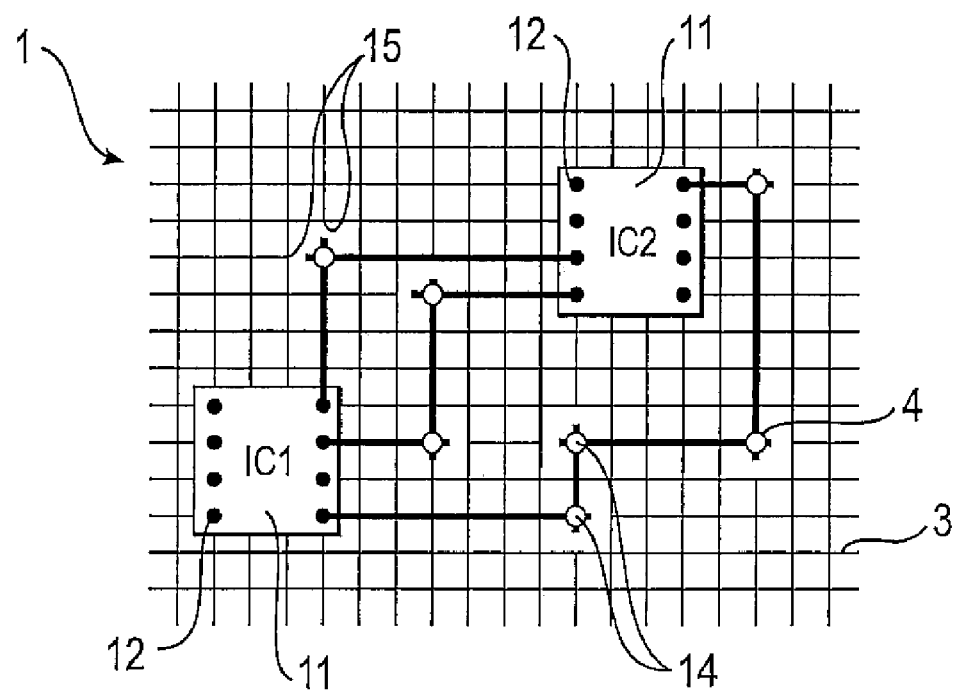
FIG. 2 shows a connection arrangement of two electric components located on a circuit board according to the invention.

In FIG. 2 the basic arrangement of two electric components 11 on a circuit board 1 according to the invention is shown. For the sake of clarity only the conductive threads 3 are depicted in FIG. 2, while the non-conductive threads 2 are omitted. To produce a desired conductor line the insulation of two electrically conductive threads 3 is removed by a laser at a particular point of intersection 4. Afterwards the stripped points of the two electrically conductive threads 3 are connected in an electrically conductive manner by means of a conductive adhesive or soldering tin. Thus, a conductive point of connection 14 is produced between two conductive threads 3. In order to spatially restrict a conductor line produced electrically conductive threads 3 can be disconnected by a cut 15 at the appropriate points. This cut can be effected by a laser.

The individual electric components 10 have connecting arrangements 12. These connecting arrangements 12 have to be connected to the respective electrically conductive threads 3 provided for this purpose. To this end the external insulation of an electrically conductive thread 3 is also removed at a defined point, as already set out above. By preference, points of intersection are suited to this. By means of an electrically conductive adhesive these points of contact are connected in an electrically conductive manner with a connecting point of the connecting arrangement 12. This is carried out for each connecting point of an electric component 11.

Figure 3:
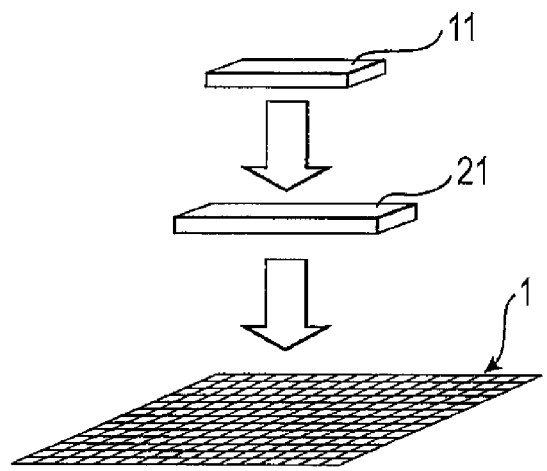
FIG. 3 shows the application of an electric component with an adapter element to a circuit board according to the invention.

To facilitate the positioning of components 11 on the extremely fine circuit board 1 an adapter element 21 is provided in FIG. 3. In the case of a very small spacing 6 the adapter element 21 facilitates a precise positioning on the desired points of contact, as the adapter element 21 is preferably designed with greater dimensions than the component 11. As a result of the adapter element 21 a better physical connection with the circuit board 1 is achieved. Another advantage of the adapter element 21 can be seen in the fact that the adapter element 21 can be adapted precisely to the employed circuit board 1 and its spacing 6, whereby a facilitated production of a circuit is rendered possible with the circuit board 1 according to the invention. The upper side of the adapter element 21, to which the component 11 is fixed, can again be adapted to specific components 11. The electric or electronic component 11 can be placed without problem onto the adapter element 21.

Figure 4:
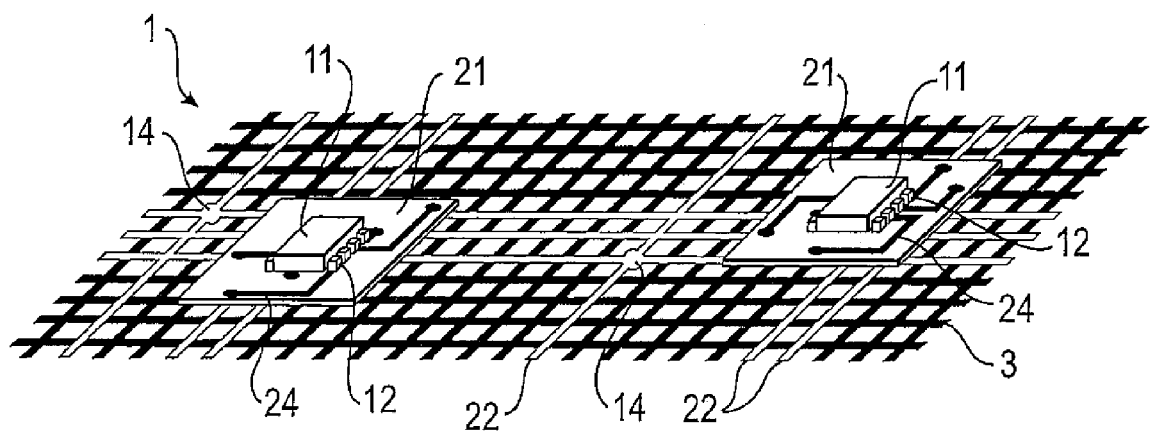
FIG. 4 shows a circuit board according to the invention with two electric components mounted thereon.

As illustrated in FIG. 4, not all electrically conductive threads 3 of a circuit board 1 are required for the set-up of a circuit. (In this case again the conductive threads 3 are depicted only). In FIG. 4 the electrically conductive threads 22 used are shown in grey colour. On the illustrated section of the circuit board 1 two components 11 are mounted on the circuit board 1 by means of adapter elements 21. To straighten the points of contact between the component 11 and the circuit board 1 the adapter element 21 has lines 24 that lead from the connecting arrangements 12 to the respective connecting points with the circuit board 1.

In addition, it is illustrated in FIG. 4 that cuts in conductive threads 3 are not always necessary. Through skillful use of the electrically conductive threads 3 cuts may even become completely unnecessary. This is of advantage because in the production of a circuit with the circuit board 1 according to the invention one production step can be dispensed with so that the production can be carried out in a more cost-effective way and with greater stability.

With the circuit board in accordance with the invention that consists of electrically conductive and electrically non-conductive threads a component is provided which can be used in a manner similar to a conventional printed circuit board and which, when being combined with textiles, hardly affects or deteriorates the textile properties of the carrier material.

The foregoing description of the preferred embodiments of this invention has been presented for purposes of illustration and description. It is not intended to be exhaustive or to limit the invention to the precise form disclosed, and obviously, many modifications and variations are possible.

The invention claimed is:

1. A highly flexible circuit board, in which electrically non-conductive threads and electrically conductive threads sheathed with an electrically insulating material are woven to a fabric, wherein:
    at least the electrically conductive threads are arranged as warp threads and weft threads and form a regular mesh structure in the entire fabric with an equal spacing between the electrically conductive threads; and
    every electrically non-conductive thread has a higher tensile strength than any of the electrically conductive threads.

2. The circuit board according to claim 1,
    wherein the electrically non-conductive threads and the electrically conductive threads have a diameter ranging between 0.5 μm and 500 μm.

3. The circuit board according to claim 1,
    wherein the fabric has a mesh width from 1 μm to 1 mm and the fabric has a thickness from 1 μm to 1 mm.

4. The circuit board according to claim 1,
    wherein the electrically conductive threads have a core.

5. The circuit board according to claim 4,
    wherein the core is formed of a material selected from the group consisting of copper, brass, aluminium and polypyrrole.

6. The circuit board according to claim 4,
    wherein the core of the electrically conductive threads is coated with a material comprising at least one of silver and gold.

7. The circuit board according to claim 1,
    wherein the electrically insulating material that sheaths the electrically conductive threads comprises a plastic.

8. The circuit board according to claim 7,
    wherein the plastic is selected from the group consisting of polyethylene, polyurethane, polyester or polyamide.

9. The circuit board according to claim 1,
    wherein the fabric includes at least one of monofilament threads and multifilament threads.

10. The circuit board according to claim 1,
    wherein the mesh structure formed by the electrically conductive threads has the same spacing both in the weft thread and in the warp thread direction and the spacing ranges between 5 μm and 4 mm.

11. The circuit board according to claim 1,
    wherein the fabric includes more electrically non-conductive threads than electrically conductive threads.

12. The circuit board according to claim 1,
    wherein at least one adapter element is applied to the circuit board in electrically conductive contact with at least one of the electrically conductive threads and at least one component is mounted on the adapter element.

13. A textile comprising at least two layers,
    wherein at least one layer comprises a fabric woven from electrically non-conductive threads and electrically conductive threads sheathed with an electrically insulating material, and wherein:
    at least the electrically conductive threads are arranged as warp threads and weft threads and form a regular mesh structure in the entire fabric with an equal spacing between the electrically conductive threads; and
    every electrically non-conductive thread has a higher tensile strength than any of the electrically conductive threads.

14. The textile according to claim 13,
    wherein at least one layer comprises a material selected from the group consisting of a film, fabric and felt.

15. A method for producing a highly flexible circuit board, comprising:
    weaving electrically non-conductive threads and electrically conductive threads that are sheathed with an electrically insulating material to a fabric, and wherein the weaving further comprises: and
    arranging at least the electrically conductive threads as warp threads and weft threads to form a regular mesh structure in the entire fabric with an equal spacing between the electrically conductive threads;
    wherein every electrically non-conductive thread has a higher tensile strength than any of the electrically conductive threads.

16. The method according to claim 15, further comprising:
    forming a desired line structure by connecting and/or disconnecting particular electrically conductive threads.

* * * * *